(12) United States Patent
Wang et al.

(10) Patent No.: US 10,483,490 B2
(45) Date of Patent: Nov. 19, 2019

(54) OLED PANEL, METHOD FOR MANUFACTURING THE SAME AND DISPLAY DEVICE

(71) Applicant: BOE TECHNOLOGY GROUP CO., LTD., Beijing (CN)

(72) Inventors: Chunjan Wang, Beijing (CN); Huaiting Shih, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 90 days.

(21) Appl. No.: 15/321,477

(22) PCT Filed: Mar. 16, 2016

(86) PCT No.: PCT/CN2016/076519
§ 371 (c)(1),
(2) Date: Dec. 22, 2016

(87) PCT Pub. No.: WO2016/169368
PCT Pub. Date: Oct. 27, 2016

(65) Prior Publication Data
US 2018/0190938 A1 Jul. 5, 2018

(30) Foreign Application Priority Data
Apr. 24, 2015 (CN) .......................... 2015 1 0201061

(51) Int. Cl.
H01L 51/52 (2006.01)
H01L 51/56 (2006.01)
(Continued)

(52) U.S. Cl.
CPC .......... *H01L 51/5253* (2013.01); *H01L 22/30* (2013.01); *H01L 51/0031* (2013.01);
(Continued)

(58) Field of Classification Search
CPC . H01L 51/0031; H01L 51/5253; H01L 51/56; H01L 22/30; H01L 27/3246; H01L 51/52; H01L 51/525
(Continued)

(56) References Cited

U.S. PATENT DOCUMENTS

2005/0140291 A1* 6/2005 Hirakata ............. H01L 27/3211
313/512
2006/0199461 A1 9/2006 Yasaki et al.
(Continued)

FOREIGN PATENT DOCUMENTS

CN 102007616 A 4/2011
CN 102450098 A 5/2012
(Continued)

OTHER PUBLICATIONS

Chinese First Office Action for Chinese Application No. 201510201061.9, dated Nov. 26, 2015, 6 Pages.
(Continued)

*Primary Examiner* — Dzung Tran
(74) *Attorney, Agent, or Firm* — Brooks Kushman P.C.

(57) ABSTRACT

The present disclosure discloses an OLED panel, a method for manufacturing the same and a display device. The OLED panel includes a substrate, a cover plate, an OLED device and an encapsulation structure. The encapsulation structure includes a thin-film encapsulation layer and an encapsulation adhesive, and a hydrochromic material is added in the encapsulation structure.

13 Claims, 3 Drawing Sheets

(51) Int. Cl.
*H01L 21/66* (2006.01)
*H01L 51/00* (2006.01)

(52) U.S. Cl.
CPC ........ *H01L 51/524* (2013.01); *H01L 51/5256* (2013.01); *H01L 51/5259* (2013.01); *H01L 51/56* (2013.01)

(58) Field of Classification Search
USPC ...................................................... 257/40, 59
See application file for complete search history.

(56) References Cited

U.S. PATENT DOCUMENTS

| | | | | |
|---|---|---|---|---|
| 2007/0114536 | A1* | 5/2007 | Lee | H01J 9/02 257/72 |
| 2009/0051286 | A1* | 2/2009 | Yamazaki | G02F 1/136227 313/512 |
| 2014/0103368 | A1* | 4/2014 | Hatano | H01L 27/3246 257/88 |
| 2014/0252383 | A1* | 9/2014 | Senda | H01L 51/5044 257/88 |

FOREIGN PATENT DOCUMENTS

| | | |
|---|---|---|
| CN | 103531718 A | 1/2014 |
| CN | 103531719 A | 1/2014 |
| CN | 103730071 A | 4/2014 |
| CN | 104821376 A | 8/2015 |

OTHER PUBLICATIONS

International Search Report and Written Opinion for Application No. PCT/CN2016/076519, dated Jun. 22, 2016, 13 Pages.

Chinese Second Office Action for Chinese Application No. 201510201061.9, dated Mar. 24, 2016, 7 Pages.

* cited by examiner

OLED PANEL, METHOD FOR MANUFACTURING THE SAME AND DISPLAY DEVICE

CROSS-REFERENCE TO RELATED APPLICATIONS

This application is the U.S. national phase of PCT Application No. PCT/CN2016/076519 filed on Mar. 16, 2016, which claims priority to Chinese Patent Application No. 201510201061.9 filed on Apr. 24, 2015, the disclosures of which are incorporated in their entirety by reference herein.

TECHNICAL FIELD

The present disclosure relates to the field of display technology, in particular to an organic light emitting diode (OLED) panel, a method for manufacturing the same and a display device.

BACKGROUND

Along with a rapid development of display technology, an organic light emitting diode (OLED) is gradually taking place of a traditional liquid crystal display. The OLED display technology has many outstanding merits such as self-illumination, low-energy consumption, high contrast, wide-angle view, being available for flexible displaying, etc. As a result, OLED with great development potential is considered to be a next generation display technology, a replacement for the liquid crystal display.

Despite the rapid development, the OLED display technology still has many problems which need to be solved, including that it is difficult to detect an OLED-panel encapsulation effect, detecting sensitivity is low, and it is difficult to determine a defect position, etc. An OLED device usually uses a sandwich structure. An organic light-emitting layer is sandwiched between two electrodes on its both sides, and a hole and an electron are respectively injected into an anode and a cathode. The hole and electron are transported in the organic light-emitting layer, and meet to form an exciton. And then light is emitted due to exciton recombination. The organic light-emitting layer is easy to react with water vapor. A compound produced by the reaction significantly reduces quantum efficiency of the OLED device. Hence, an encapsulation level of the OLED panel directly impacts reliability and service life of the OELD device. The detection of the OLED panel encapsulation effect and the determination of the defect position of the encapsulation are of great importance to improve yield of the OLED panel and reduce cost. There are very few detecting techniques for an encapsulation structure of the OLED panel in the related art. Usually, professional equipment needs to be used for detecting water vapor content, or an addition structure for detecting water vapor is added in the encapsulation structure which increases process complexity.

In the encapsulation structure, there is often residue or foreign matter on a contact surface between an encapsulating adhesive and glass, resulting in an imperfect fit. There may also be a defect when a thin film encapsulation layer is coated in vacuum, or foreign matter on a surface of thin film encapsulation layer may also result in that the thin film encapsulation layer is coated imperfectly. In addition, usually, a thermal curing process on the encapsulation adhesive is needed in the related art, and it is easy to create an opening on the encapsulation adhesive in the thermal curing process. The water vapor may enter in through these defects, most of which are in nanoscale, thus reducing the reliability and service life of the OELD device. It is difficult to detect these nano-scaled defects by a detecting device in a current production line, or a complex detecting method is needed.

SUMMARY

An object of the present disclosure is to provide an OLED panel, a method for manufacturing the same and a display device, so as to solve the problems of complexity and low sensitivity in detecting the OLED panel encapsulation effect.

To achieve the above-mentioned object, according to embodiments of the present disclosure, the technical solution production is provided as follows.

An OLED panel includes: a substrate and a cover plate which are arranged opposite to each other, an OLED device arranged on the substrate, and an encapsulation structure arranged between the substrate and the cover plate, wherein the encapsulation structure includes a thin-film encapsulation layer and an encapsulation adhesive, a side of the OLED device which is away from the substrate is covered with the thin-film encapsulation layer, and a hydrochromic material is added in the thin-film encapsulation layer and/or the encapsulation adhesive.

Optionally, the encapsulation adhesive includes a first encapsulation adhesive, wherein a side of the thin-film encapsulation layer, which is away from the substrate, is covered with the first encapsulation adhesive in which the hydrochromic material is added.

Optionally, the encapsulation adhesive further includes a second encapsulation adhesive, and the second encapsulation adhesive is configured to surround the first encapsulation adhesive and prevent the first encapsulation adhesive from being in contact with water vapor.

Optionally, the encapsulation adhesive includes a first encapsulation adhesive, a second encapsulation adhesive and a third encapsulation adhesive, wherein a side of the thin film encapsulation layer, which is away from the substrate, is covered with the first encapsulation adhesive, the second encapsulation adhesive in which the hydrochromic material is added is configured to surround the first encapsulation adhesive, and the third encapsulation adhesive is configured to surround the second encapsulation adhesive and prevent the second encapsulation adhesive from being in contact with water vapor.

Optionally, the thin-film encapsulation layer is formed at the side of the OLED device which is away from the substrate, and includes a multi-layer structure formed by inorganic encapsulation layers and organic encapsulation layers which are alternatively arranged in order in a direction away from the OLED device. The total number of the inorganic encapsulation layers and organic encapsulation layers is at least three, and the hydrochromic material is added in at least one organic encapsulation layer. A side of the thin-film encapsulation layer, which is away from the substrate, is covered with the encapsulation adhesive which is configured to prevent the thin-film encapsulation layer from being in contact with water vapor.

Optionally, the total number of the inorganic encapsulation layers and organic encapsulation layers is three.

Optionally, the hydrochromic material is a metal salt whose color changes when it is in contact with water.

Optionally, the metal salt is CaO or $CuSO_4$.

The present disclosure also provides a method for manufacturing an OLED panel, including steps of: providing, a substrate and a cover plate; forming, an OLED device on the substrate; forming, an encapsulation structure on the substrate, wherein the encapsulation structure includes a thin-film encapsulation layer and an encapsulation adhesive, a side of the OLED device, which is away from the substrate, is covered with the thin-film encapsulation layer, and a hydrochromic material is added in the thin-film encapsulation layer and/or the encapsulation adhesive; and aligning the cover plate with the substrate provided with the OLED device and the encapsulation structure, attaching the cover plate on the substrate, and curing the encapsulation adhesive with ultraviolet so as to form the OLED panel.

Optionally, the step of forming the encapsulation structure includes: forming, a thin-film encapsulation layer on a side of the OLED device which is away from the substrate; and forming, a first encapsulation adhesive on a side of the thin-film encapsulation layer which is away from the OLED device, wherein a hydrochromic material is added in the first encapsulation adhesive.

The step of forming the encapsulation structure further includes: forming, a second encapsulation adhesive which is configured to surround the first encapsulation adhesive, to prevent the first encapsulation adhesive from being in contact with water vapor.

Optionally, the step of forming the encapsulation structure includes: forming, the thin-film encapsulation layer on a side of the OLED device which is away from the substrate; forming, a first encapsulation adhesive on a side of the thin-film encapsulation layer which is away from the OLED device; forming, a second encapsulation adhesive which is configured to surround the first encapsulation adhesive, wherein the hydrochromic material is added in the second encapsulation adhesive; and forming, a third encapsulation adhesive which is configured to surround the second encapsulation adhesive, to prevent the second encapsulation adhesive from being in contact with water vapor.

Optionally, the step of forming the encapsulation structure includes: forming, a thin-film encapsulation layer on a side of the OLED device which is away from the substrate, wherein the thin-film encapsulation layer includes a multilayer structure formed by inorganic encapsulation layers and organic encapsulation layers which are alternatively arranged in order in a direction away from the OLED device, the total number of the inorganic encapsulation layers and organic encapsulation layers is at least three, and the hydrochromic material is added in at least one organic encapsulation layer; forming, the encapsulation adhesive on the thin-film encapsulation layer to prevent the thin-film encapsulation layer from being in contact with water vapor.

Optionally, the total number of the inorganic encapsulation layers and organic encapsulation layers is three.

Optionally, the hydrochromic material is a metal salt whose color changes when it is in contact with water.

Optionally, the metal salt is CaO or $CuSO_4$.

The present disclosure provides a display device including any of the OLED panels mentioned above.

According to the embodiments of the present disclosure, the OLED panel includes a substrate, a cover plate, an OLED device and an encapsulation structure. The encapsulation structure includes a thin-film encapsulation layer and an encapsulation adhesive, and a hydrochromic material is added in the thin-film encapsulation layer and/or the encapsulation adhesive. The hydrochromic material has high sensitivity on its color to the water vapor. After the color changes, the OLED panel encapsulation effect can be determined, and a position of a defect region in the encapsulation structure of the OLED panel is determined according to a region of the encapsulation structure where the color changes. According to the OLED panel, the method for manufacturing the OLED panel and the display device, provided by the present disclosure, it is able to improve the detection sensitivity, detect the OLED panel encapsulation effect and determine the position of the defect region.

BRIEF DESCRIPTION OF THE DRAWINGS

Accompany drawings herein are provided for a further understanding of the present disclosure and merely parts of embodiments of the present disclosure. The exemplary embodiments of the present disclosure and description thereof are used for explanation purposes, without having any limiting effect.

Figure 1:
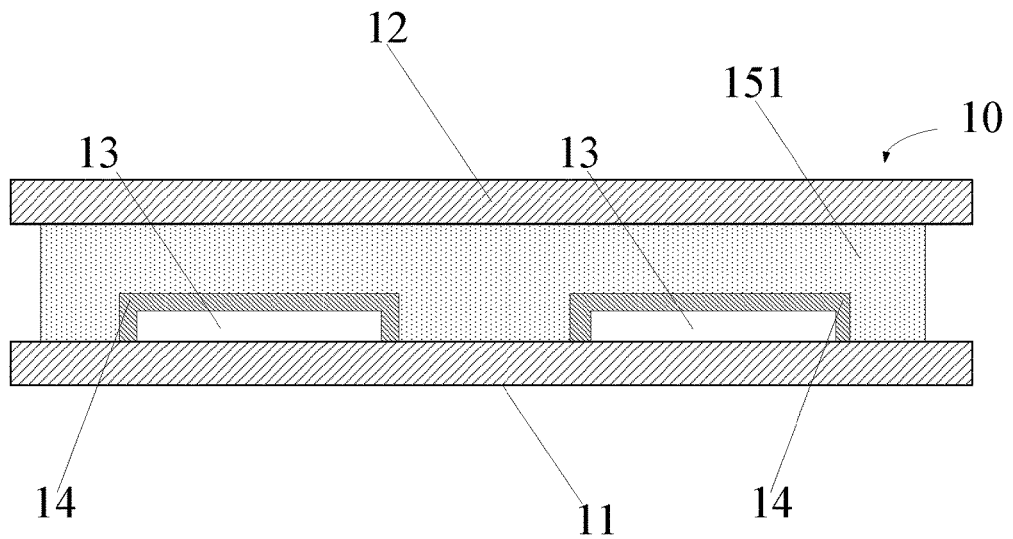
FIG. 1 is a schematic view showing an OLED panel according to the embodiments of the present disclosure.

| Reference numerals: | |
| --- | --- |
| 10 - OLED panel, | 11 - substrate, |
| 12 - cover plate, | 13 - OLED device, |
| 14 - thin-film encapsulation layer, | 15 - encapsulation adhesive, |
| 141 - inorganic encapsulation layer, | 142 - organic encapsulation layer, |
| 151 - first encapsulation adhesive, | 152 - second encapsulation adhesive, |
| 153 - third encapsulation adhesive | |

DETAILED DESCRIPTION

The present disclosure will be described hereinafter in a clear and complete manner in conjunction with the drawings and embodiments. Apparently, the following embodiments are merely a part of, rather than all of, the embodiments of the present disclosure. Based on these embodiments, other embodiments, which can be obtained by the persons of ordinary skills in the art without any inventive effort, also fall within the scope of the present disclosure.

Unless otherwise defined, any technical or scientific terms used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than being limited to physical or mechanical connection. Such words as "on/above", "under/below", "left" and "right" are merely used to represent relative position relationship, and when an absolute position of an object is changed, the relative position relationship will be changed too.

The OLED panel provided by the present disclosure includes a substrate and a cover plate which are arranged opposite to each other, an OLED device arranged on the substrate, and an encapsulation structure arranged between the substrate and the cover plate. The encapsulation structure includes a thin-film encapsulation layer and an encapsulation adhesive, a side of the OLED device which is away from the substrate is covered with the thin-film encapsulation layer, and a hydrochromic material is added in the thin-film encapsulation layer and/or the encapsulation adhesive.

It has a very high sensitivity to the water vapor for the capability of the hydrochromic material to selectively absorb visible light, so such material can be used to detect whether there is a nano-scaled defect, while an existing detecting device generally can only detect a micro-scale defect. Further, it will not increase the complexity of the manufacturing process when adding the hydrochromic material into the thin-film encapsulation layer or the encapsulation adhesive, i.e. it is able to not add a new structure to an existing OLED encapsulation structure. In addition, since the hydrochromic material is distributed in the encapsulation structure, after its color changes, a position of a defect region in the encapsulation structure of the OLED panel may be determined according to a region of the encapsulation structure where the color changes.

Specifically, referring to FIG. 1, in some embodiments, the present disclosure provides an OLED panel 10 including a substrate 11 and a cover plate 12 which are arranged opposite to each other, an OLED device 13 arranged on the substrate 11, a thin-film encapsulation layer 14 covering a side of the OLED device 13 which is away from the substrate, and a first encapsulation adhesive 151 arranged on a side of the thin-film encapsulation layer 14 which is away from the substrate. The hydrochromic material is added in the encapsulation adhesive 151.

The hydrochromic material refers to a material which has a very high sensitivity to the water vapor on its capability of selectively absorbing visible light. The hydrochromic material can include a metal salt whose color changes when it is in contact with water. Specifically, $CuSO_4$ or CaO can be selected. When it is in contact with the water vapor, the color of $CuSO_4$ changes from colorless into blue, and the color of CaO changes from white into colorless.

The thin-film encapsulation layer 14 may include an organic encapsulation layer, an inorganic encapsulation layer, or a composite film which is formed by overlapping the organic encapsulation layer with the inorganic encapsulation layer, or a passivation layer. An inorganic adhesive material can be selected for the first encapsulation adhesive 151.

When the water vapor passes through the defect of the encapsulation structure of the OLED panel, the water vapor will be in contact with the hydrochromic material in the first encapsulation adhesive 151 and make a change in the capability of the hydrochromic material to selectively absorb visible light, which causes the color of the first encapsulation adhesive 151 to change. Due to the extremely high sensitivity of the capability of the hydrochromic material to selectively absorb visible light to the water vapor, the nano-scaled defect in the encapsulation structure can be detected, while the existing detecting device generally can only detect the micro-scale defect. In addition, the hydrochromic material is added in the first encapsulation adhesive 151 without increasing complexity of the process, i.e. there is no need to add a new structure to the existing OLED encapsulation structure. Also, the hydrochromic material is distributed in the first encapsulation structure 151, and after its color changes, the defect region in the encapsulation structure of the OLED panel can be determined according to a region of the first encapsulation adhesive 151 where the color changes.

Figure 2:
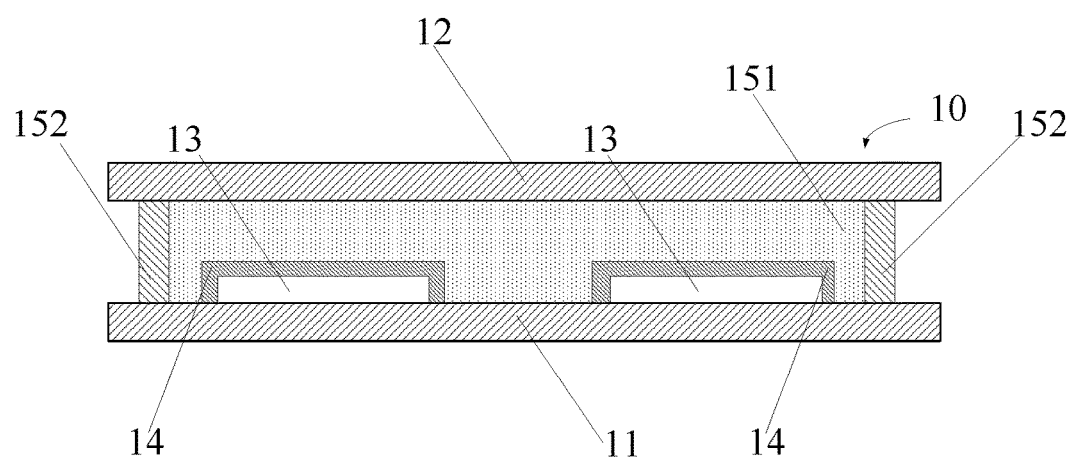
FIG. 2 is a schematic view showing an OLED panel according to the embodiments of the present disclosure.

Referring to FIG. 2, in some embodiments, the present disclosure provides an OLED panel 10 including the substrate 11 and the cover plate 12 which are arranged opposite to each other, the OLED device 13 arranged on the substrate 11, the thin-film encapsulation layer 14 covering a side of the OLED device 13 which is away from the substrate, and a first encapsulation adhesive 151 arranged on a side of the thin-film encapsulation layer 14 which is away from the substrate. In order to enhance the ability of isolating water vapor of the first encapsulation adhesive 151, a second encapsulation adhesive 152 which is configured to surround the first encapsulation adhesive 151 is formed to prevent the first encapsulation adhesive 151 from being in contact with water vapor. The hydrochromic material is added in the first encapsulation adhesive 151.

The hydrochromic material refers to a material which has a very high sensitivity to the water vapor on its capability of selectively absorbing visible light. The hydrochromic material includes a metal salt whose color changes when it is in contact with water. Specifically, $CuSO_4$ or CaO can be selected. When it is in contact with the water vapor, the color of $CuSO_4$ changes from colorless into blue, and the color of CaO changes from white into colorless. The thin-film encapsulation layer 14 may include an organic encapsulation layer, an inorganic encapsulation layer, a composite film which is formed by overlapping the organic encapsulation layer with the inorganic encapsulation layer, or only one passivation layer. The inorganic adhesive material can be selected for the first encapsulation adhesive 151 and the second encapsulation adhesive 152.

When the water vapor break through the encapsulation structure of the second encapsulation adhesive 152, the water vapor will be in contact with the hydrochromic material in the first encapsulation adhesive 151 and make a change in the capability of the hydrochromic material to selectively absorb the visible light, which causes the color of the first encapsulation adhesive 151 to change. Due to the extremely high sensitivity of the capability of the hydrochromic material to selectively absorb visible light to the water vapor, the nano-scaled defect in the encapsulation structure can be detected, while the existing detecting device generally can only detects the micro-scale defect. In addition, the hydrochromic material is added in the first encapsulation adhesive 151 without increasing complexity of the process, i.e. there is no need to add a new structure to the existing OLED encapsulation structure. Also, the hydrochromic material is distributed in the first encapsulation structure 151, and after its color changes, the defect region in the encapsulation structure 151 of the OLED panel can be determined according to a region of the first encapsulation adhesive 151 where the color changes. Since the second encapsulation adhesive 152 is configured to surround the first encapsulation adhesive 151, a probability of a contact of the first encapsulation adhesive 151 and the water vapor can be reduced and the product yield is improved.

Figure 3:
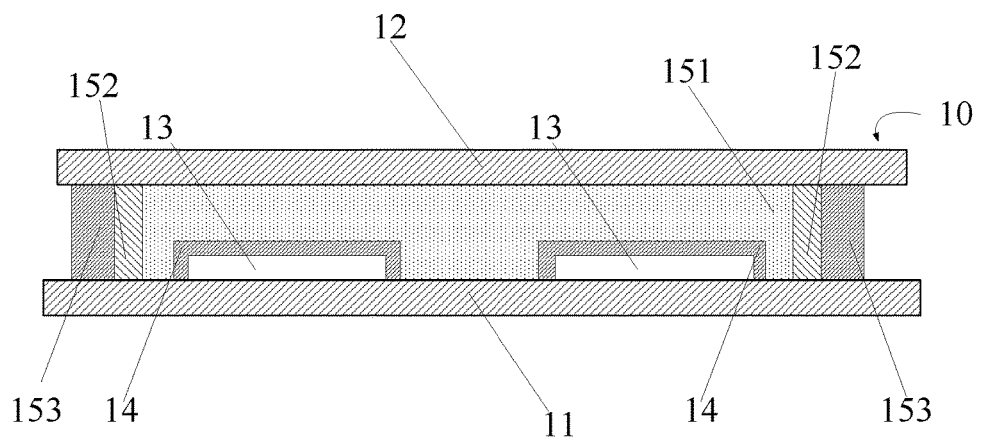
FIG. 3 is a schematic view showing an OLED panel according to the embodiments of the present disclosure.

Referring to FIG. 3, in some embodiments, the present disclosure provides an OLED panel 10 including a substrate 11 and a cover plate 12 which are arranged opposite to each other, the OLED device 13 arranged on the substrate 11, the thin-film encapsulation layer 14 covering a side of the OLED device 13 which is away from the substrate, a first encapsulation adhesive 151, a second encapsulation adhesive 152 and a third encapsulation adhesive 153. The first encapsulation adhesive 151, the second encapsulation adhesive 152 and the third encapsulation adhesive 153 are arranged between the substrate and the cover plate. The first encapsulation adhesive 151 covers a side of the thin-film encapsulation layer 14, which is away from the substrate. The second encapsulation adhesive 152 in which the hydrochromic material is added is configured to surround the first encapsulation adhesive 151. The third encapsulation adhesive 153 is configured to surround the second encapsulation adhesive 152 and prevent the second encapsulation adhesive 152 from being in contact with water vapor.

The hydrochromic material refers to a material which has a very high sensitivity to the water vapor on its capability of selectively absorbing visible light. The hydrochromic material includes a metal salt whose color changes when it is in contact with water. Specifically, $CuSO_4$ or CaO can be selected. When it is in contact with the water vapor, the color of $CuSO_4$ changes from colorless into blue, and the color of CaO changes from white into colorless. The thin-film encapsulation layer 14 may include an organic encapsulation layer, an inorganic encapsulation layer, a composite film which is formed by overlapping the organic encapsulation layer with the inorganic encapsulation layer, or the passivation layer. The inorganic adhesive material can be selected for the first encapsulation adhesive 151, the second encapsulation adhesive 152 and the third encapsulation adhesive 153.

When the water vapor break through the third encapsulation adhesive 153 of the OLED panel, the water vapor will be in contact with the hydrochromic material in the second encapsulation adhesive 152 and make a change in the capability of the hydrochromic material to selectively absorb the visible light, which causes the color of the second encapsulation adhesive 152 to change. Due to the extremely high sensitivity of the capability of the hydrochromic material to selectively absorb visible light to the water vapor, the nano-scaled defect in the encapsulation structure can be detected, while the existing detecting device generally can only detects the micro-scale defect. In addition, the hydrochromic material is added in the second encapsulation adhesive 152 without increasing complexity of the process, i.e. there is no need to add a new structure to the existing OLED encapsulation structure. Also, the hydrochromic material is distributed in the first encapsulation structure 152, and after its color changes, the defect region in the encapsulation structure of the OLED panel can be determined according to a region of the second encapsulation adhesive 152 where the color changes. Since the third encapsulation adhesive 153 is configured to surround the second encapsulation adhesive 152, a probability of a contact of the second encapsulation adhesive 152 and the water vapor can be reduced and the product yield is improved. Besides, since the first encapsulation adhesive 151 is arranged, it can prevent the OLED device from being in contact with the water vapor in the encapsulation adhesive 152. Therefore, whether there is a defect in the encapsulation structure that has a bad effect on the OLED device can be detected in advance as the OLED works normally.

Figure 4:
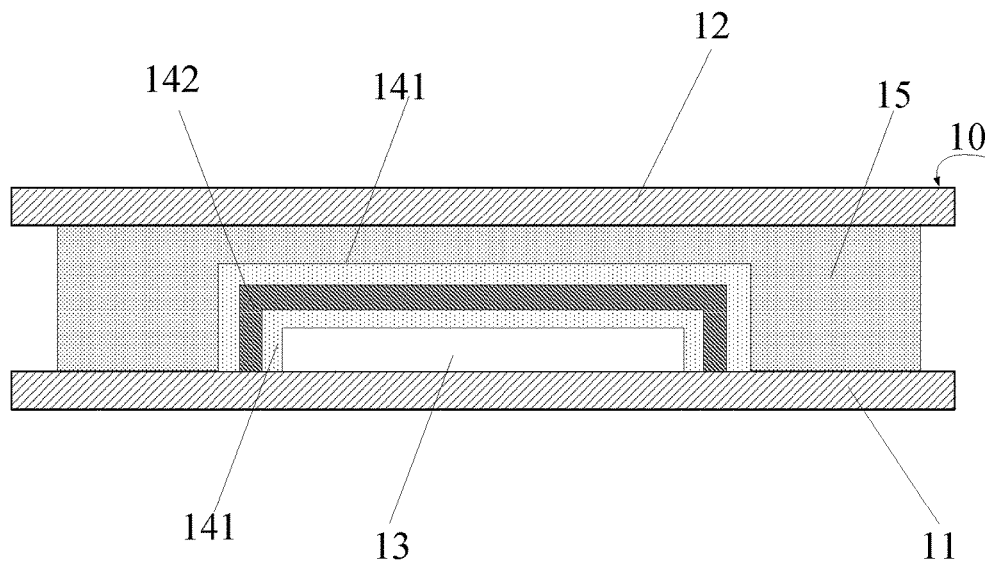
FIG. 4 is a schematic view showing an OLED panel according to the embodiments of the present disclosure.

Referring to FIG. 4, in some embodiments, the present disclosure provides an OLED panel 10 including a substrate 11 and a cover plate 12 which are arranged opposite to each other, the OLED device 13 arranged on the substrate 11, the thin-film encapsulation layer 14 arranged on a side of the OLED device 13 which is away from the substrate, and an encapsulation adhesive 15 arranged on a side of the thin-film encapsulation layer 14 which is away from the substrate. The thin-film encapsulation layer 14 includes a multi-layer structure formed by inorganic encapsulation layer(s) and organic encapsulation layer(s) which are alternately arranged in order in a direction away from the OLED device. The total number of the inorganic encapsulation layers 141 and organic encapsulation layers 142 is at least three. The hydrochromic material is added in at least one organic encapsulation layer. The encapsulation adhesive 15 is configured to prevent the thin-film encapsulation layer 14 from being in contact with water vapor.

Optionally, the total number of the inorganic encapsulation layers 141 and organic encapsulation layers 142 is three. The organic encapsulation layer 142 in which the hydrochromic material is added is sandwiched between two inorganic encapsulation layers 141.

Optionally, the hydrochromic material refers to a material which has a very high sensitivity to the water vapor on its capability of selectively absorbing visible light. The hydrochromic material includes a metal salt whose color changes when it is in contact with water. Specifically, $CuSO_4$ or CaO can be selected. When it is in contact with the water vapor, the color of $CuSO_4$ changes from colorless into blue, and the color of CaO changes from white into colorless.

The encapsulation adhesive 15 is configured to surround the thin-film encapsulation layer 14 and prevent the thin-film encapsulation layer from being in contact with water vapor. The organic encapsulation layers 142 in the thin-film encapsulation layer 14 not only has a water-blocking function or a detection function of water-vapor permeation, but also has a stress releasing function on the inorganic encapsulation layer 141 in the multi-layer structure. In addition, the organic encapsulation layer 142 is not made by a vacuum coating process, and compared with the inorganic encapsulation layer 141, it has a larger thickness. Hence, the hydrochromic material is added in the organic encapsulation layer, i.e., a second encapsulation layer 142 without changing a film forming process, and a negative impact of the hydrochromic material on the encapsulation effect is minimized. The hydrochromic material refers to a material which has a very high sensitivity to the water vapor on its capability of selectively absorbing visible light. Due to the extremely high sensitivity of the capability, the nano-scaled defect in the encapsulation structure can be detected, while the existing detecting device generally can only detect the micro-scale defect. In addition, the hydrochromic material is distributed in the second encapsulation layer 142, and after its color changes, the defect region in the encapsulation structure of the OLED panel can be determined according to a region of the second encapsulation layer 142 where the color changes.

In the above embodiments, the substrate includes a glass substrate or a plastic substrate, and the cover plate includes a glass plate or a hard film. The OLED generally includes electrodes and functional layers, wherein the functional layer includes one or more layers of: a hole injection layer, a hole transporting layer, an electron injection layer, an electron transporting layer and a light-emitting layer. It should be noted that, a detailed structure and a connecting circuit of the OLED device are not shown in the drawings. A person skilled in the art may select an OLED with a top-emitting or bottom-emitting structure as well as the connecting circuit according to an actual situation.

Figure 5:
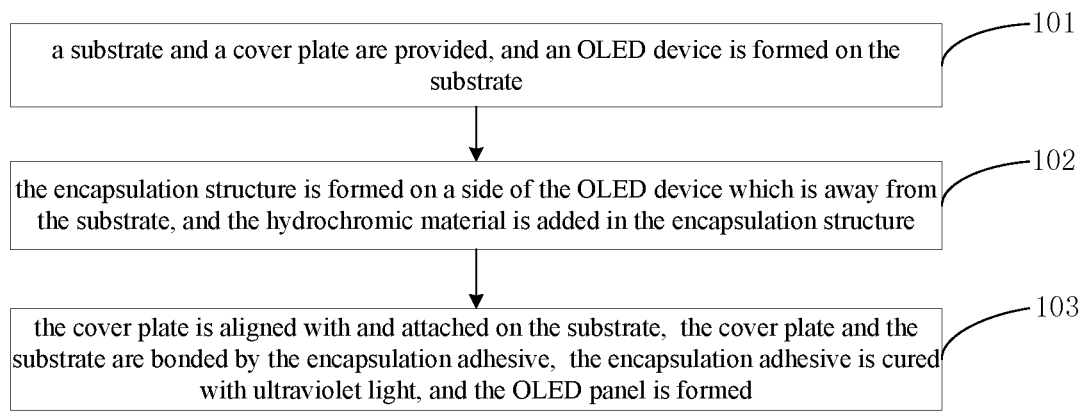
FIG. 5 is a schematic flow chart of a method for manufacturing an OLED panel according to the embodiments of the present disclosure.

Referring to FIG. 5, according to the embodiments, the present disclosure provides a method for manufacturing an OLED panel, including following steps.

In step 101, a substrate and a cover plate are provided, and an OLED device is formed on the substrate.

Specifically, the substrate includes an array substrate of thin film transistors and the OLED may be formed on the substrate by a patterning process, evaporation process, a transfer print process, a solution production coating process, etc.

In step 102, the encapsulation structure is formed on the substrate, wherein a hydrochromic material is added in the encapsulation structure.

Specifically, the thin-film encapsulation layer can be formed on a side of the OLED device which is away from the substrate by a patterning process.

The encapsulation adhesive is formed on the substrate.

A hydrochromic material is added in the thin-film encapsulation layer and/or the encapsulation adhesive.

In step 103, the cover plate is aligned with and attached on the substrate provided with structures formed by the above steps. The encapsulation adhesive is cured with ultraviolet light, and then the OLED panel is formed.

In addition, specifically, the step 102 of forming the encapsulation structure on a side of the OLED device which is away from the substrate includes: forming the thin-film encapsulation layer on a side of the OLED device which is away from the substrate by plasma enhanced chemical vapor deposition (PECVD), evaporation or patterning processes; and forming a first encapsulation adhesive on a side of the thin-film encapsulation layer which is away from the OLED device by a coating method, wherein the hydrochromic material is added in the first encapsulation adhesive.

Further, the step 102 of forming the encapsulation structure on a side of the OLED device which is away from the substrate may also include: forming a second encapsulation adhesive which is configured to surround the first encapsulation adhesive, to prevent the first encapsulation adhesive from being in contact with water vapor.

Optionally, the step 102 of forming the encapsulation structure on a side of the OLED device which is away from the substrate includes: forming the thin-film encapsulation layer on a side of the OLED device which is away from the substrate by PECVD, evaporation, or patterning processes; forming the first encapsulation adhesive on a side of the thin-film encapsulation layer which is away from the OLED device by a coating method; forming a second encapsulation adhesive which is configured to surround the first encapsulation adhesive by a coating method, wherein the hydrochromic material is added in the second encapsulation adhesive; and forming a third encapsulation adhesive which is configured to surround the second encapsulation adhesive by a coating method, to prevent the second encapsulation adhesive from being in contact with water vapor.

Figure 6:
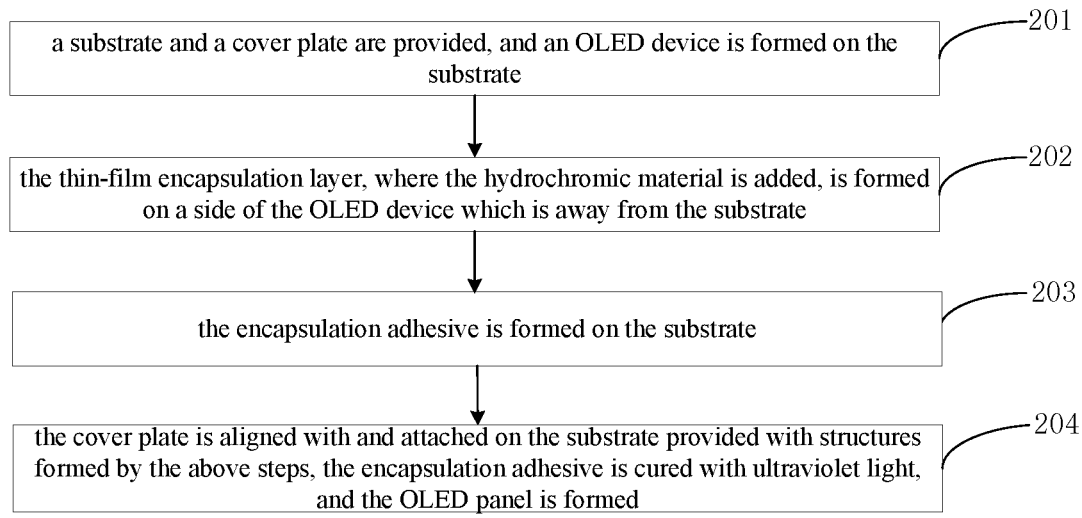
FIG. 6 is a schematic flow chart of a method for manufacturing an OLED panel according to the embodiments of the present disclosure.

Referring to FIG. 6, according to the embodiments, the present disclosure provides a method for manufacturing an OLED panel, including following steps.

In step 201, a substrate and a cover plate are provided, and an OLED device is formed on the substrate.

Specifically, the OLED is formed on the substrate by a patterning process, an evaporation process, a transfer print process, a solution production process etc.

In step 202, the thin-film encapsulation layer, in which the hydrochromic material is added, is formed on a side of the OLED device which is away from the substrate.

The thin-film encapsulation layer is formed on a side of the OLED device which is away from the substrate by PECVD, evaporation or patterning processes. The thin-film encapsulation layer includes a multi-layer structure formed by inorganic encapsulation layers and organic encapsulation layers which are alternately arranged in order in a direction away from the OLED device. The total number of the inorganic encapsulation layers and organic encapsulation layers is at least three, and the hydrochromic material is added in at least one organic encapsulation layer.

In the embodiment, the total number of the inorganic encapsulation layers and the organic encapsulation layers may be three. The hydrochromic material includes the metal salt whose color changes when it is in contact with water. Specifically, $CuSO_4$ or $CaO$ can be selected. When it is in contact with the water vapor, the color of $CuSO_4$ changes from colorless into blue, and the color of $CaO$ changes from white into colorless.

In step 203, the encapsulation adhesive is formed on the substrate.

The encapsulation adhesive is formed between the substrate and the cover plate for bonding the substrate and the cover plate.

In step 204, the substrate is aligned with and attached to the cover plate. The cover plate and the substrate are bonded together through the encapsulation adhesive which is then cured with ultraviolet light, and the OLED panel is formed.

In the method for manufacturing the OLED panel provided by the embodiment of the present disclosure, the arranged encapsulation structure includes the thin-film encapsulation layer and the encapsulation adhesive. The encapsulation adhesive is cured with ultraviolet light, to avoid a tiny opening to be formed on the encapsulation structure, so as to prevent the water vapor from permeating into the OLED device. The cover plate and the substrate are bonded more tightly, to prevent a permeating path from being formed on a bonded boundary surface. The hydrochromic material is added in the encapsulation structure. Due to the extremely high sensitivity of the capability of the hydrochromic material to selectively absorb visible light to the water vapor, the nano-scaled defect in the encapsulation structure can be detected, while the existing detecting device generally can only detect the micro-scale defect. In addition, the hydrochromic material is added in the thin-film encapsulation layer or in the encapsulation adhesive without adding a new structure to the existing OLED encapsulation structure, i.e. it will not increase the complexity of the manufacturing process. Also, since the hydrochromic material is distributed in the encapsulation structure, after its color changes, a position of the defect region in the encapsulation structure of the OLED panel may be determined according to the region of the encapsulation structure where the color changes.

In some embodiments, the present disclosure provides a display device including any of the OLED panels in the above embodiments. The display device may be any product or part having a display function, such as a phone, a tablet computer, a television, a laptop, a digital photo frame and a navigator, etc.

The display device provided by the embodiments of the present disclosure uses any of the above OLED panels. The OLED panel is provided with the encapsulation structure where a material whose color changes when it is in contact with water is added. The encapsulation adhesive in the encapsulation structure is cured with ultraviolet light, to avoid a tiny opening to be formed on the encapsulation structure, to prevent the water vapor from permeating into the OLED device. Also, the cover plate and the substrate are bonded more tightly, to prevent a permeating path from being formed on a bonded boundary surface. Due to the extremely high sensitivity of the capability of the hydrochromic material in the encapsulation structure to selectively absorb visible light to the water vapor, the nano-scaled defect in the encapsulation structure can be detected, while the existing detecting device generally detects only the micro-scale defect. In addition, the hydrochromic material is added in the thin-film encapsulation layer or in the encapsulation adhesive without adding a new structure to the existing OLED encapsulation structure, i.e. it will not increase the complexity of the manufacturing process. Also, since the hydrochromic material is distributed in the encapsulation structure, after its color changes, a position of the defect region in the encapsulation structure of the OLED panel may be determined according to the region of the encapsulation structure where the color changes.

The above are merely the preferred embodiments of the present disclosure and shall not be used to limit the scope of the present disclosure. It should be noted that, a person skilled in the art may make improvements and modifications without departing from the principle of the present disclosure, and these improvements and modifications shall also fall within the scope of the present disclosure.

What is claimed is:

1. An organic light emitting diode (OLED) panel, comprising:
   a substrate;
   a cover plate, arranged opposite to the substrate;
   an OLED device, arranged on the substrate; and
   an encapsulation structure, arranged between the substrate and the cover plate;
   wherein the encapsulation structure comprises a thin-film encapsulation layer and an encapsulation adhesive; a side of the OLED device, which is away from the substrate, is covered with the thin-film encapsulation layer; and a hydrochromic material is added in the thin-film encapsulation layer and/or the encapsulation adhesive; and
   wherein the hydrochromic material is CuSO$_4$ whose color changes when it is in contact with water; and
   wherein the encapsulation adhesive comprises a first encapsulation adhesive, a second encapsulation adhesive and a third encapsulation adhesive; and
   a side of the thin film encapsulation layer, which is away from the substrate, is covered with the first encapsulation adhesive;
   the second encapsulation adhesive, in which the hydrochromic material is added, surrounds the first encapsulation adhesive; and
   the third encapsulation adhesive surrounds the second encapsulation adhesive and prevent the second encapsulation adhesive from being in contact with water vapor.

2. The OLED panel according to claim 1, wherein the first encapsulation adhesive has the hydrochromic material added therein.

3. The OLED panel according to claim 2, wherein the second encapsulation adhesive prevents the first encapsulation adhesive from being in contact with water vapor.

4. An organic light emitting diode (OLED) panel, comprising:
   a substrate;
   a cover plate, arranged opposite to the substrate;
   an OLED device, arranged on the substrate; and
   an encapsulation structure, arranged between the substrate and the cover plate;
   wherein the encapsulation structure comprises a thin-film encapsulation layer and an encapsulation adhesive; a side of the OLED device, which is away from the substrate, is covered with the thin-film encapsulation layer; and a hydrochromic material is added in the thin-film encapsulation layer and/or the encapsulation adhesive;
   wherein the hydrochromic material is CuSO$_4$ whose color changes when it is in contact with water, and
   wherein
   the thin-film encapsulation layer is formed at the side of the OLED device which is away from the substrate, and comprises a multi-layer structure formed by inorganic encapsulation layers and organic encapsulation layers which are alternately arranged in order in a direction away from the OLED device, the total number of the inorganic encapsulation layers and organic encapsulation layers is at least three, and the hydrochromic material is added in at least one organic encapsulation layer; and
   a side of the thin-film encapsulation layer, which is away from the substrate, is covered with the encapsulation adhesive which prevents the thin-film encapsulation layer from being in contact with water vapor.

5. The OLED panel according to claim 4, wherein the total number of the inorganic and organic encapsulation layers is three.

6. A method for manufacturing an organic light emitting diode (OLED) panel, comprising steps of:
   providing a substrate and a cover plate;
   forming an OLED device on the substrate;
   forming an encapsulation structure on the substrate, wherein the encapsulation structure comprises a thin-film encapsulation layer and an encapsulation adhesive, a side of the OLED device, which is away from the substrate, is covered with the thin-film encapsulation layer, and a hydrochromic material is added in the thin-film encapsulation layer and/or the encapsulation adhesive; and
   aligning the cover plate with the substrate provided with the OLED device and the encapsulation structure, attaching the cover plate on the substrate, and curing the encapsulation adhesive with ultraviolet light, to form the OLED panel,
   wherein the hydrochromic material is CuSO$_4$ whose color changes when it is in contact with water, and
   wherein the step of forming the encapsulation structure comprises:
   forming the thin-film encapsulation layer on the side of the OLED device which is away from the substrate;
   forming a first encapsulation adhesive on a side of the thin-film encapsulation layer which is away from the OLED device;
   forming a second encapsulation adhesive which surrounds the first encapsulation adhesive, wherein the hydrochromic material is added in the second encapsulation adhesive; and
   forming a third encapsulation adhesive which surrounds the second encapsulation adhesive, to prevent the second encapsulation adhesive from being in contact with water vapor.

7. The method for manufacturing the OLED panel according to claim 6, wherein the step of forming the encapsulation structure comprises:
   on the side of the OLED device which is
   adding the hydrochromic material in the first encapsulation adhesive.

8. The method for manufacturing the OLED panel according to claim 7, wherein the second encapsulation adhesive prevents the first encapsulation adhesive from being in contact with water vapor.

9. The method for manufacturing the OLED panel according to claim 6, wherein the step of forming the encapsulation structure further comprises:
wherein the thin-film encapsulation layer comprises a multi-layer structure formed by inorganic encapsulation layers and organic encapsulation layer(s) which are alternately arranged in order in a direction away from the OLED device, the total number of the inorganic encapsulation layers and organic encapsulation layer(s) is at least three, and the hydrochromic material is added in at least one organic encapsulation layer; and
forming the encapsulation adhesive on the thin-film encapsulation layer to prevent the thin-film encapsulation layer from being in contact with water vapor.

10. The method for manufacturing the OLED panel according to claim 9, wherein the total number of the inorganic and organic encapsulation layers is three.

11. A display device, comprising an organic light emitting diode (OLED) panel of claim 1.

12. The display device according to claim 11, wherein the first encapsulation adhesive has the hydrochromic material added therein.

13. The display device according to claim 12, wherein the second encapsulation adhesive prevents the first encapsulation adhesive from being in contact with water vapor.

* * * * *